United States Patent [19]

Speck et al.

[11] 4,219,807

[45] Aug. 26, 1980

[54] SENSOR SYSTEM FOR AN IMPRESSED CATHODIC PROTECTION CIRCUIT

[75] Inventors: Robert M. Speck, Richmond; Lawrence E. Beil, Kingwood, both of Tex.

[73] Assignee: Cathodic Protection Services, Inc., Houston, Tex.

[21] Appl. No.: 896,954

[22] Filed: Apr. 17, 1978

[51] Int. Cl.² .......................................... G08B 21/00
[52] U.S. Cl. .................................. 340/664; 340/507; 340/663; 340/691; 307/95; 324/72; 324/65 CR
[58] Field of Search ............... 340/664, 663, 691, 693, 340/507; 307/95; 324/72, 65 CR, 64

[56] References Cited

U.S. PATENT DOCUMENTS

| | | | |
|---|---|---|---|
| 3,247,500 | 4/1966 | Grazio et al. | 340/663 |
| 3,264,627 | 8/1966 | Austin | 340/507 |
| 3,603,973 | 9/1971 | Hough | 340/693 |
| 3,696,365 | 10/1972 | Ward | 340/664 |
| 3,769,521 | 10/1973 | Caldwell et al. | 307/95 |
| 3,860,912 | 1/1975 | Romans | 340/664 |
| 3,919,565 | 11/1975 | Clark et al. | 340/664 |

Primary Examiner—Glen R. Swann, III
Attorney, Agent, or Firm—Michael P. Breston

[57] ABSTRACT

The sensor system senses a drop in the flow of impressed cathodic protection current to a minimum threshold level. A potential difference is developed which is a sample of the cathodic protection current. A comparator receives the sample potential difference and normally produces an output control signal which drops to substantially zero when the cathodic protection current drops to a predetermined threshold level. A relay responsive to the control signal then switches a signaling device to its signaling condition. A standby battery is also coupled to the signaling device through the relay. In the event of any failure in the sensor system or in the primary source of power energizing the sensor system, the standby battery becomes connected to the signaling device to cause it to change to its signaling condition.

3 Claims, 15 Drawing Figures

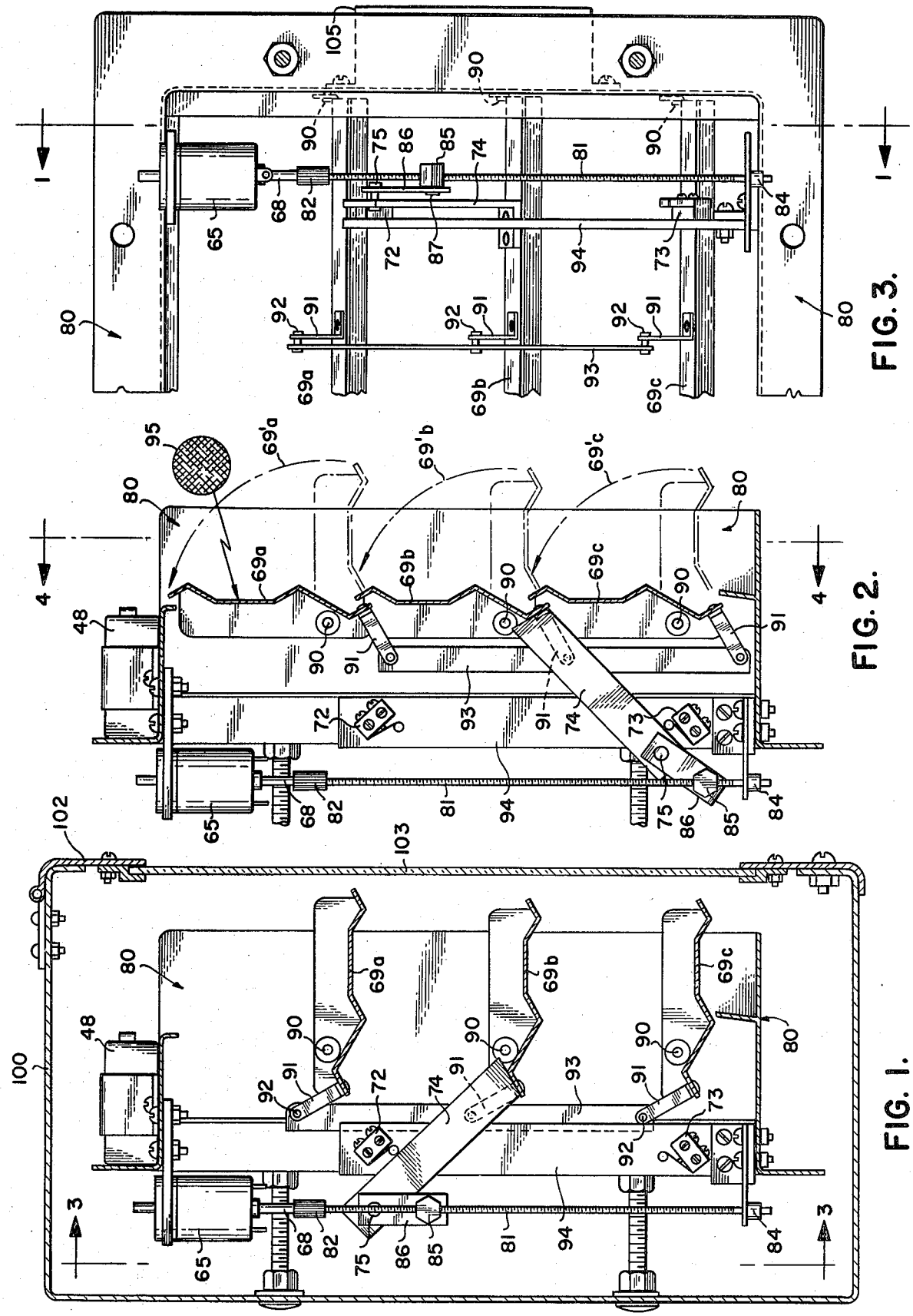

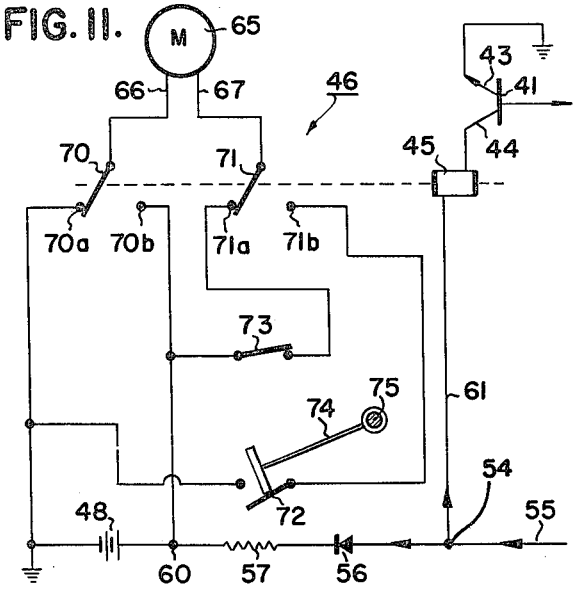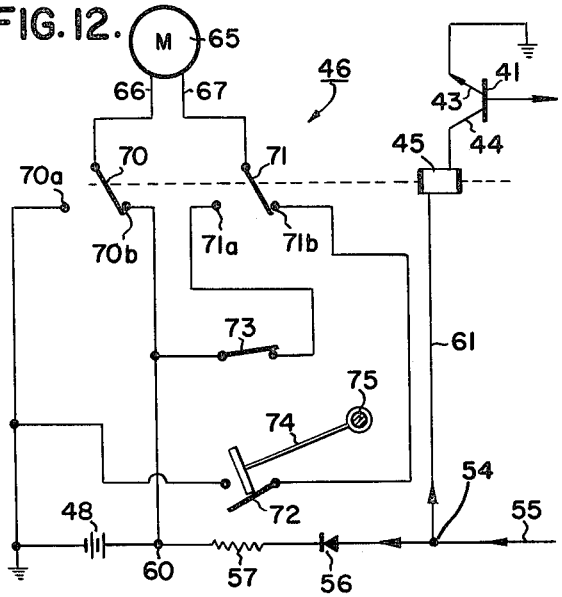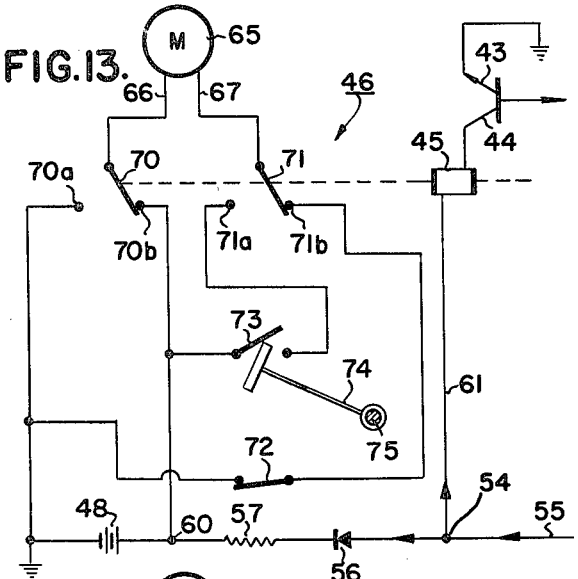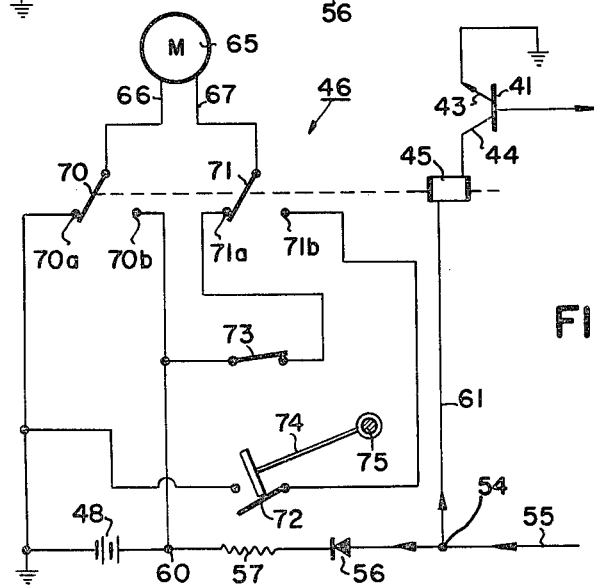

SENSOR SYSTEM FOR AN IMPRESSED CATHODIC PROTECTION CIRCUIT

BACKGROUND OF THE INVENTION

Metallic conductors such as buried pipelines, offshore platforms, etc., require cathodic protection against corrosion. Impressed current cathodic protection systems are widely used, and different such systems have been described in the literature. Such impressed current systems will provide the desired cathodic protection, provided that the cathodic protection current remains above a predetermined value. The cathodic protection current will vary because the resistance in the cathodic protection circuit normally changes. For example, in connection with buried pipelines, the cathodic protection current is impressed onto electrodes buried in a ground bed site. The resistance of the cathodic protection circuit will depend on the effective soil resistance, on other underground metallic structures located in the vicinity of the buried pipeline, on the electric insulation of the various current carrying conductors, etc.

The cathodic protection current can also change as a result of changes in the voltage of the primary source of power. Defects in the insulation of the wiring and welded connections will cause current to be discharged through the insulation and other imperfections. Also, in many regions of the world wide seasonal variations occur in the pipe-to-soil resistivity. Even the buried anodes in the ground bed site deteriorate with age requiring additional cathodic protection current.

From the above it will be apparent that both the voltage and the current in the cathodic protection circuit can vary, and an appreciable drop in either is likely to cause corrosion in the pipeline or other conductor being cathodically protected. Moreover, storm activity or other hazards can cause a breakdown in the commonly used rectifiers in cathodic protection circuits, thereby stopping the flow of cathodic protection current entirely.

Relay circuits have been provided for detecting a drop in the impressed cathodic protection current flowing to a conductor being protected against corrosion. However, such relay circuits that are known have been generally unreliable in that they were difficult to regulate, relatively insensitive to minor changes in cathodic protection current flow, and required a substantial voltage drop before they could provide the desired alert signal to indicate an abnormality.

SUMMARY OF THE INVENTION

The sensor system for sensing a reduction in the cathodic protection current flowing in a cathodic protection circuit comprises sampling means coupled to the circuit for developing a sample signal representative of the current flowing in the circuit. Comparator means receive the sample signal and produce an output control signal when the sample signal is above a threshold level. A relay is responsive to the output control signal and controls the energization of a signaling device. An auxiliary battery can also energize the signaling device through the contacts of the relay in the event of a failure of the sensor system or in the energization thereof.

BRIEF DESCRIPTION OF THE DRAWINGS

FIG. 1 is a side view, partly in section, of the sensor system with the signaling device in its non-signaling condition;

FIG. 2 is similar to FIG. 1 but with the signaling device in its signaling condition;

FIG. 3 is a rear view taken along line 3—3 on FIG. 1;

FIGS. 11, 14 and 15 are schematic circuit diagrams of the relay circuit used in the sensor system of FIG. 1 with the relay being de-energized; and FIGS. 12 and 13 are similar to FIG. 11 but with the relay being energized.

DETAILED DESCRIPTION OF THE INVENTION

Figure 4:
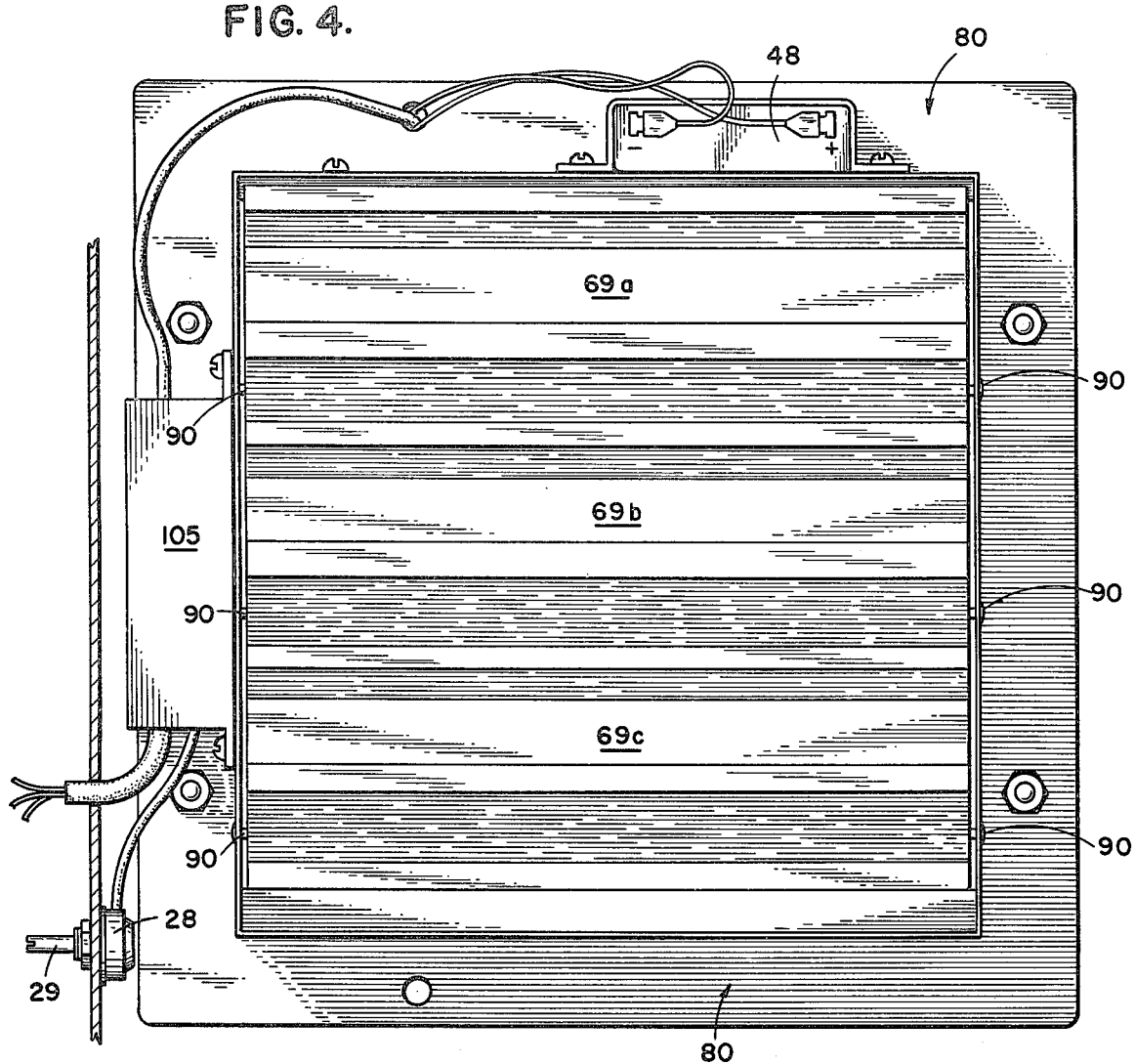
FIG. 4 is a front view of the signaling system taken along line 4—4 of FIG. 2 with the signaling device in its non-signaling condition.

Throughout the drawings the same reference characters will be used to designate the same or similar parts to facilitate the understanding thereof.

A. The Electronic Network

Figure 10:
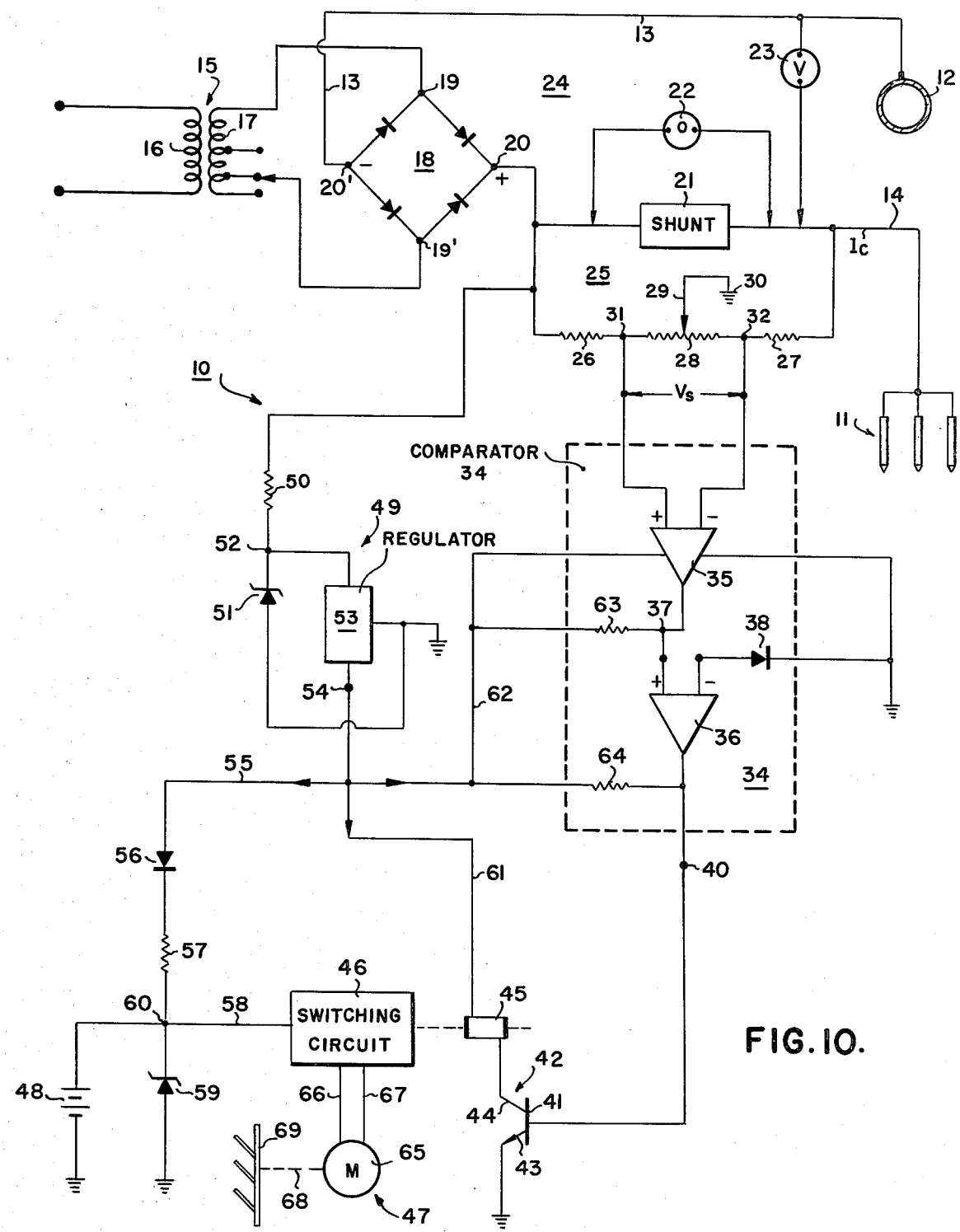
FIG. 10 shows a schematic electric circuit diagram of a preferred embodiment of the sensor system in accordance with the present invention.

The invention provides a sensor system, generally designated as 10 (FIG. 10), having an electronic network for sensing a drop in the cathodic protection current $I_c$ flowing to electrodes 11 (FIG. 8) buried in a ground bed site in the vicinity of a buried pipeline 12. The current from the anodes to the pipeline flows through the ground bed site between cables 13, 14. The cathodic protection current is typically obtained from commercial power lines carrying 110 or 220 AC current. The voltage is stepped down by a transformer 15 having a primary winding 16 and a tapped secondary winding 17. The tap arrangement on the secondary winding allows the selection of the desired voltage for the cathodic protection circuit. The stepped down AC voltage is rectified by a rectifier element, typically a full-wave bridge network 18, having a pair of input terminals 19, 19' and a pair of output terminals 20, 20'. Cable 13 is connected to the negative output of the rectifier 18 at terminal 20', and cable 14 is typically connected to the positive terminal 20 through a calibrated resistor or shunt 21 for providing a sample measurement of the cathodic protection current $I_c$ flowing through an ammeter 22 connected in parallel with the shunt 21. A voltmeter 23 connected across lines 13 and 14 provides a measurement of the voltage V at which the cathodic protection current is applied between pipeline 12 and electrodes 11.

For the reasons above described, either voltmeter 23 or the ammeter 22 may indicate a drop. Either drop produces a drop in the applied power $P=VI_c$ to the electrodes 11. When the power drop P is appreciable and reaches a predetermined level, pipeline 12 may be insufficiently cathodically protected. The circuit thus far described forms a conventional cathodic protection circuit, generally designated as 24.

The sensor system 10 of the present invention will sense a drop in the cathodic protection power P. Conveniently such drop will be measured with the use of a voltage divider, generally designated as 25, consisting of a pair of fixed resistors 26, 27 and of an adjustable potentiometer 28 connected therebetween and having a tap 29 connected to a reference potential or to the circuit ground 30. Voltage divider 25 is connected in parallel with the shunt 21.

The potentiometer 28 has a junction 31 with resistor 26 and has a junction 32 with resistor 27. The potential difference $V_s$ between junctions 31, 32 is sensed by the sensor system 10. It will be apparent that the voltage $V_s$ will depend upon the position of the tap 29 on the potentiometer 28 and on the voltage provided by the rectifier bridge 18 at its positive output terminal 20.

The developed potential difference $V_s$ is applied to a comparator, generally designated as 34, preferably having two stages 35, 36. The positive input terminal to stage 35 is connected to junction 31 and its negative input terminal is connected to junction 32. The output terminal 37 of stage 35 is connected to the positive input terminal of stage 36 whose negative input terminal is connected to ground through a diode 38, polarized as shown.

The output terminal 40 of comparator 34 is applied to the base 41 of a transistor 42 having a collector 44 in circuit with a relay 45 and a grounded emitter 43. Relay 45 operates on switches forming part of a switching circuit 46 connected to a signaling device, generally designated as 47. The switching circuit 46 controls the power applied to the signaling device 47 either by an auxiliary battery 48 or by an energizing circuit, generally designated as 49, which is connected to the positive output terminal 20 of the rectifier 18.

Thus, the sensor system 10 may be energized by the voltage supplied to the cathodic protection circuit 24. The energizing circuit 49 includes a current limiting resistor 50 connected to ground through a zener diode 51. The junction 52 between resistor 50 and diode 51 is connected to ground through a regulator 53 having an output terminal 54 supplying a regulated voltage to a bus line 55. Bus 55 supplies current to the switching circuit 46 through a blocking diode 56 and a current-limiting resistor 57. Resistor 57 is connected to an input line 58 leading to the switching circuit 46. Line 58 is connected to ground through a zener diode 59 having a junction 60 with the resistor 57.

The positive terminal of the auxiliary battery 48 is connected to junction 60. Line 55 is also connected to relay 45 through a line 61. Line 55 supplies power to the comparator stage 35 through a line 62. The output terminal 37 of comparator stage 35 is connected to line 55 through a resistor 63, and the output terminal 40 of comparator stage 36 is connected to line 55 through a resistor 64.

In the preferred embodiment, the signaling device 47 includes a bi-directional motor 65 having a pair of input lines 66, 67 connected to the switching circuit 46. Motor 65 drives a shaft 68 either clockwise or counter-clockwise. A visible signal-emitting device 69 is coupled to shaft 68. Device 69 emits a visible signal when shaft 68 rotates in one direction, and does not emit such a visible signal when shaft 68 rotates in an opposite direction, as will be more fully explained hereinafter.

The switching circuit 46 (FIGS. 11-15) includes a pair of single-pole, double-throw switches 70, 71. Switch 71 has a pair of terminals 71a, 71b, and switch 70 has a pair of terminals 70a, 70b. Terminal 70a is connected to ground and terminal 70b is connected to junction 60. Terminal 71a is connected to terminal 70b through a limit switch 73. Terminal 71b is connected to terminal 70a through a limit switch 72. Limit switches 72, 73 are operated by a switch actuator arm 74 which is pivotable about a pivot 75. The rotation of arm 74 is caused by the rotation of the output shaft 68 of motor 65 (FIG. 1). Switches 72 and 73 are normally closed and open only when arm 74 exerts pressure against one or the other of them. The directions of the currents flowing in the various branch circuits of the sensor system 10 are represented by solid arrows.

The operation of the electronic portion of the sensor system 10 thus far described will now be given to facilitate the subsequent description of the mechanical portion of the system.

The stepped-down AC voltage is adjusted on the secondary winding 17 so that the rectified DC voltage at the output terminal 20 of rectifier bridge 18 provides the desired impressed voltage reading V on voltmeter 23. Depending on the effective resistance between the electrodes 11 and the pipeline 12, the impressed current $I_c$ should have a predetermined desired value. The cathodic protection circuit 24 then functions, as intended, to provide adequate protection to pipeline 12 against corrosion.

It is the object of the sensor system 10 of this invention to detect a predetermined drop in the cathodic protection power P applied to the pipeline-to-electrode circuit. A sample representation of that power $P=V\times I_c$ is provided by the potentiometer 28, that is, by the potential difference $V_s$ between junctions 31, 32. When current $I_c$ drops to a minimum value, $V_s$ has a threshold level which will trigger the system 10. The threshold of $V_s$ can be adjusted by the centertap 29 over a wide range, say between two millivolts and 75 millivolts. Signaling device 47 will be in its non-signaling condition if $V_s$ is greater than the minimum 2 millivolts and it will move into its signaling condition when $V_s$ falls below 2 millivolts.

As will be apparant to those skilled in the electronics art, when junction 31 is more positive than junction 32 by the minimum 2 millivolts, current will be flowing from the output terminal 37 of comparator stage 35 into comparator stage 36, thereby allowing current to flow out of the output terminal 40 of comparator 36 and into the base 41 of transistor 42, which serves both as a switch and as a current amplifier for the current flowing through the relay.

The energizing circuit 49 will provide a regulated voltage to bus line 55 substantially independent of variations in the output voltage of the rectifier bridge 18 at output terminal 20. Bus 55 will be charging the auxiliary battery 48 and the rate of charging will be controlled by the zener diode 59. The auxiliary battery 48 is connected to the motor 65 only when there is a power failure or a component failure in the sensor system 10, as will be subsequently described.

B. The Mechanical Portion

Motor 65 is mounted on a box-shaped frame, generally designated as 80 (FIGS. 1-3). Its output shaft 68 is coupled to a threaded shaft 81 through a connector 82. The outer end of the threaded shaft 81 rotates in a bearing 84. A threaded nut 85 is threadedly mounted on shaft 81 for vertical movement thereon when the shaft 81 is rotated. One end of a linkage plate 86 is pivotally mounted on a pivot 87 (FIG. 3) extending from nut 85. The other end of plate 86 is pivotally mounted on pivot 75, previously described in connection with FIG. 11.

The signal emitting device 69 includes three shutters 69a-69c each rotatably mounted on pivot pins 90 which project from the side walls of frame 80. Also pivotally mounted on pivot 75 is one end of the limit switch actuator arm 74 whose other end is secured to the center shutter 69b. Each one of shutters 69a-69c has fixed thereto one end of a drive link 91. The other end of each link 91 is pivotally mounted on a pivot pin 92 carried by a link connector bar 93. Thus rotation of shutter 69b is transmitted to the adjacent shutters 69a and 69c by bar 93 and links 91.

A limit switch support plate 94 is mounted on the base 80 for supporting the two vertically spaced-apart limit switches 72, 73. As previously described, these limit switches are normally closed and open only when actuated by the switch actuator arm 74. When arm 74 moves to a position so as to open a limit switch, the energization of motor 20 becomes interrupted, thereby stopping the rotation of the threaded shaft 22 and hence the rotation of the shutters 69a-69c.

Figure 5:
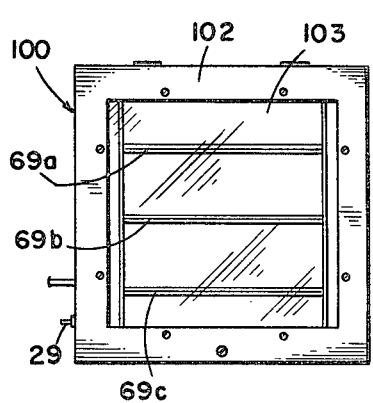
FIG. 5 is a reduced view of FIG. 4 with the signaling device in its non-signaling condition.
Figure 6:
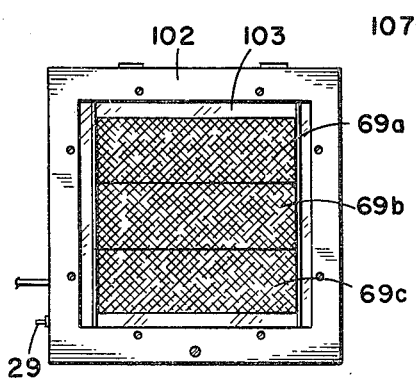
FIG. 6 is a view similar to FIG. 5 but with the signaling device in its signaling condition.

The shutters have front faces which are signal emitting and are painted in a visible color such as luminous orange, as indicated by the cross-hatching 95 in FIGS. 2 and 4. On the other hand, the back faces of the shutters are painted in a color which is not signal emitting, say black. Thus when the shutters are open (FIGS. 1, 3, 5), the signal emitting device 69 is in its non-signaling condition and when the shutters are closed it is in its signaling condition.

The electronic portion of sensor system 10 is enclosed in a box 105 (FIG. 4) mounted on a side wall of frame 80 which is enclosed in a housing 100 having a hinged door 102 provided with a window 103. The threshold $V_s$ of the sensor system 10 is adjustable by the rotatable shaft 29 on potentiometer 28. Shaft 29 extends outwardly from housing 100.

In operation of the signaling device 47, when the relay 45 is energized the shutters 69a-69c are open (FIGS. 1, 3-5), and the positions of the limit switches are as shown in FIG. 12. The normally-closed limit switch 72 is maintained open by the switch actuator arm 74, and limit switch 73 is normally closed. Consequently, line 67 of motor 65 is disconnected from ground by limit switch 72 and motor 65 is de-energized.

The shaft 29 of potentiometer 28 is then rotated to obtain the desired threshold level $V_s$ which will start the closing of the shutters. Such closing is initiated by the output signal at output 40 of comparator 34 going to ground, thereby opening transistor 42 and stopping the flow of current through relay 45. The relay switches 70, 71 move to their alternate positions (FIG. 11), and motor 65 becomes immediately energized by the current flowing into the motor through limit switch 73. This current can return to ground through switch 70.

The rotation of the motor shaft 68 starts the rotation of the threaded shaft 81 which rotates the shutters 69a-69c to their closed positions in the directions of the broken arrows 69'a-69'c (FIG. 2). As soon as the threaded shaft 81 starts rotating, limit switch 72 closes. After a short time interval, limit switch 73 will open when the actuator arm 74 rotates to the end of its trajectory as shown in FIGS. 2 and 14. When limit switch 73 opens, junction 60 will be disconnected from the motor 65 and the motor will stop.

The stepped down voltage on secondary winding 17 (FIG. 10) is then adjusted whereby the predetermined current flows into the cathodic protection circuit 24. Therefore, the sample voltage $V_s$ will exceed the previously selected threshold level above described, and comparator stage 35 will provide an output control signal to the positive terminal of comparator stage 36 which results in a positive output at the output terminal 40 of comparator network 34. Transistor 42 will conduct current through the relay 45 which has the effect of "pulling in" the switches 70, 71 (FIG. 13). Motor 65 becomes energized through the limit switch 72 and its threaded shaft 81 starts rotating in a direction so as to cause the shutters 69a-69c to re-open. Limit switch 73 closes immediately after the start of rotation of the threaded shaft 81. When the shutters fully re-open, the switch actuator arm 74 assumes its position as shown in FIG. 12 which results in opening limit switch 72.

As long as the buried pipeline 12 will receive an adequate impressed cathodic protection current from the rectifier network 18 through the anodes 11 which discharge the current into the adjacent ground bed site, the shutters will stay open. The amplitude of this cathodic protection current may change due to changes in the effective soil resistance, other underground metallic structures lying adjacent to the buried pipeline and/or anodes, damage to the header cables, etc. The cathodic protection current $I_c$ can also change due to resistance changes in the pipe-to-soil path due to wide seasonal variations and anode deterioration with aging.

When the effective resistance in the cathodic protection circuit 24 increases, the amplitude of the impressed cathodic protection current drops, causing a drop in the monitored potential difference $V_s$. If $V_s$ drops to the previously adjusted threshold level for $V_s$, then the output signal at the output terminal 40 of comparator network 34 will go to ground, thereby causing relay 45 to become de-energized resulting in the closing of the shutters 69-69c as previously described.

In accordance with a very important aspect of the present invention, should there be a failure in any of the elements of the sensor system 10 or in the primary source of power applied to the transformer 15, current will stop flowing through the relay coil 45, causing its switches 70, 71 to move to their positions as shown in FIG. 15. Since limit switch 72 is being held open by switch actuator arm 74 and limit switch 73 is normally closed, current starts flowing from auxiliary battery 48 into the motor 65 through limit switch 73 thereby causing motor 65 to rotate in a direction so as to fully close the shutters, thereby signaling a malfunction in the sensor system 10, or in the energization thereof.

Figure 7:
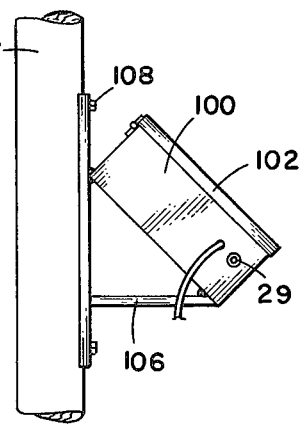
FIG. 7 is a partial side view showing the sensor system housing mounted on an electric pole.
Figure 8:
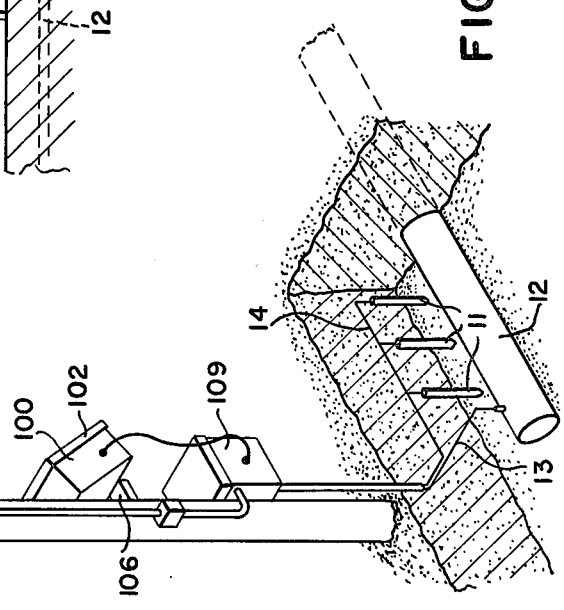
FIG. 8 is a schematic representation of a cathodic protection system utilizing the sensor system of the present invention for protecting a buried pipeline against corrosion.

As shown in FIGS. 7 and 8, the housing 100 is mounted at an angle on a mount frame 106 which is attached to a utility pole 107. Also attached to the pole 107 is a box 109 which houses the transformer and rectifier network.

Figure 9:
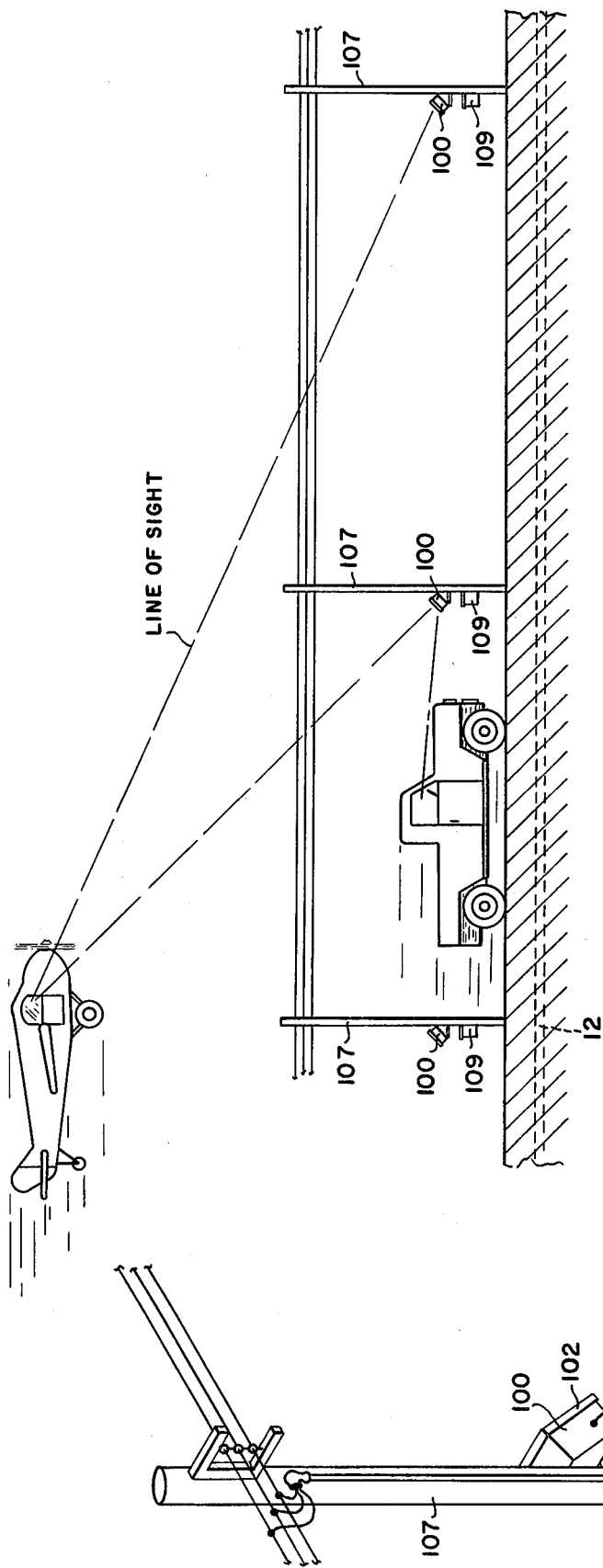
FIG. 9 shows a plurality of housings having the sensor systems of the present invention therein and being mounted on electric poles along a buried pipeline while a flying observer monitors the conditions of the systems signaling devices.

An observer driving a vehicle along or flying over the pipeline, as shown in FIG. 9, will notice the orange color of the closed shutters in any housing 100 and will stop to investigate the cause of the malfunction. For example, if he determines that the effective resistance in the cathodic protection circuit 24 has substantially increased, due to say seasonal variations, then he will adjust, for example, the output of the secondary windings 17 so as to raise the cathodic protection current $I_c$ to its desired level. Upon correcting the malfunction, the shutters will again open until the occurrence of another malfunction.

While this invention has been described in connection with specific embodiments thereof it is not limited thereto.

What is claimed is:

1. A surveillance apparatus for instantaneously sensing a cathodic protection current flowing in a cathodic protection circuit, comprising:

an energizing circuit including a regulator network connected to a primary source of energy, said network converting the receiving energy to a useful, direct-current potential for impressing a sufficient cathodic protection current to a conductor subject to corrosion;

a potentiometer connected in parallel with a branch of said cathodic protection circuit, said potentiometer having a pair of output terminals and an adjustable center tap for developing an adjustable potential difference between said output terminals;

a comparator having an output terminal and a pair of input terminals connected to said output terminals of said potentiometer for instantaneously sensing the potential difference therebetween;

a storage battery;

a switching network having a first input connected to the output of said comparator, and a second input connected to said energizing circuit and to said storage battery; and a signaling device having a pair of input terminals connected through said switching network to said energizing circuit and to said storage battery, said signaling device becoming energized either by said energizing circuit or by said storage battery depending on the condition of said switching means, said signaling device having a non-signaling state when said potential difference is above a threshold level, and a signaling state when said potential difference drops to said threshold level.

2. The surveillance apparatus of claim 1, wherein said signal emitter emits a visible signal, and, said visible signal emitter has said signaling and non-signaling states.

3. The apparatus of claim 2, wherein said visible signal emitter has colored shutters whereby the colors of said shutters are remotely visible when said signal emitter is in its signaling state.

* * * * *